United States Patent [19]

Taroumaru

[11] Patent Number: 5,252,929
[45] Date of Patent: Oct. 12, 1993

[54] RF POWER AMPLIFIER
[75] Inventor: Makoto Taroumaru, Fukuoka, Japan
[73] Assignee: Matsushita Electric Industrial Co., Ltd., Osaka, Japan
[21] Appl. No.: 889,566
[22] Filed: May 28, 1992
[30] Foreign Application Priority Data
  May 30, 1991 [JP] Japan .................. 3-126310
[51] Int. Cl.$^5$ ............................ H03G 3/30
[52] U.S. Cl. .................. 330/129; 330/134; 330/279
[58] Field of Search ............ 330/129, 134, 207 P, 330/279, 298; 455/116, 126, 127

[56] References Cited
U.S. PATENT DOCUMENTS 3,449,680  6/1969  Schilb et al. .............. 330/207 P
4,165,493  8/1979  Harrington ................. 455/116 X

*Primary Examiner*—James B. Mullins
*Attorney, Agent, or Firm*—Lowe, Price, LeBlanc & Becker

[57] ABSTRACT

An RF power amplifier includes an RF power amplifying section having a variable amplification gain. A phase shifter connected to the RF power amplifying section serves to shift a phase of an output signal of the RF power amplifying section. The phase shifter has an input terminal subjected to the output signal of the RF power amplifying section and an output terminal subjected to a signal which results from shifting the phase of the output signal of the RF power amplifying section. A control-signal generating section serves to generate a control signal on the basis of the signals at the input terminal and the output terminal of the phase shifter. The control signal depends on a power of the output signal of the RF power amplifying section. The amplification gain of the RF power amplifying section is controlled in response to the control signal.

28 Claims, 4 Drawing Sheets

RF POWER AMPLIFIER

BACKGROUND OF THE INVENTION

This invention relates to an RF (radio frequency) power amplifier for a radio transmitter, a transmitter in a wire communication system using an RF signal, or other apparatus.

Recently, down-sizing has been advanced in portable radio telephone devices and automobile telephone devices. These telephone devices can communicate with a base station via an RF signal. Thus, the telephone devices include RF power amplifiers. Smaller-size RF power amplifiers are advantageous in further advancing down-sizing of the telephone devices. Generally, the RF power amplifiers of the telephone devices have an additional function of controlling the level of the power output in accordance with an instruction from the base station.

As will be explained later, prior-art RF power amplifiers have some problems.

SUMMARY OF THE INVENTION

It is an object of this invention to provide an improved RF power amplifier.

A first aspect of this invention provides an RF power amplifier comprising an RF power amplifying section having a variable amplification gain; a phase shifter connected to the RF power amplifying section for shifting a phase of an output signal of the RF power amplifying section, the phase shifter having an input terminal subjected to the output signal of the RF power amplifying section and an output terminal subjected to a signal which results from shifting the phase of the output signal of the RF power amplifying section; means for generating a control signal on the basis of the signals at the input terminal and the output terminal of the phase shifter, the control signal depending on a power of the output signal of the RF power amplifying section; and means for controlling the amplification gain of the RF power amplifying section in response to the control signal.

A second aspect of this invention provides an RF power amplifier comprising an RF power amplifying section having a variable amplification gain; a phase shifter connected to the RF power amplifying section for shifting a phase of an output signal of the RF power amplifying section, the phase shifter having an input terminal subjected to the output signal of the RF power amplifying section and an output terminal subjected to a signal which results from shifting the phase of the output signal of the RF power amplifying section; a first detector for detecting a portion of the signal at the input terminal of the phase shifter; a second detector for detecting a portion of the signal at the output terminal of the phase shifter; means for generating a control signal on the basis of an output signal of the first detector and an output signal of the second detector; and means for controlling the amplification gain of the RF power amplifying section in response to the control signal.

DESCRIPTION OF THE PRIOR ART

Figure 1:
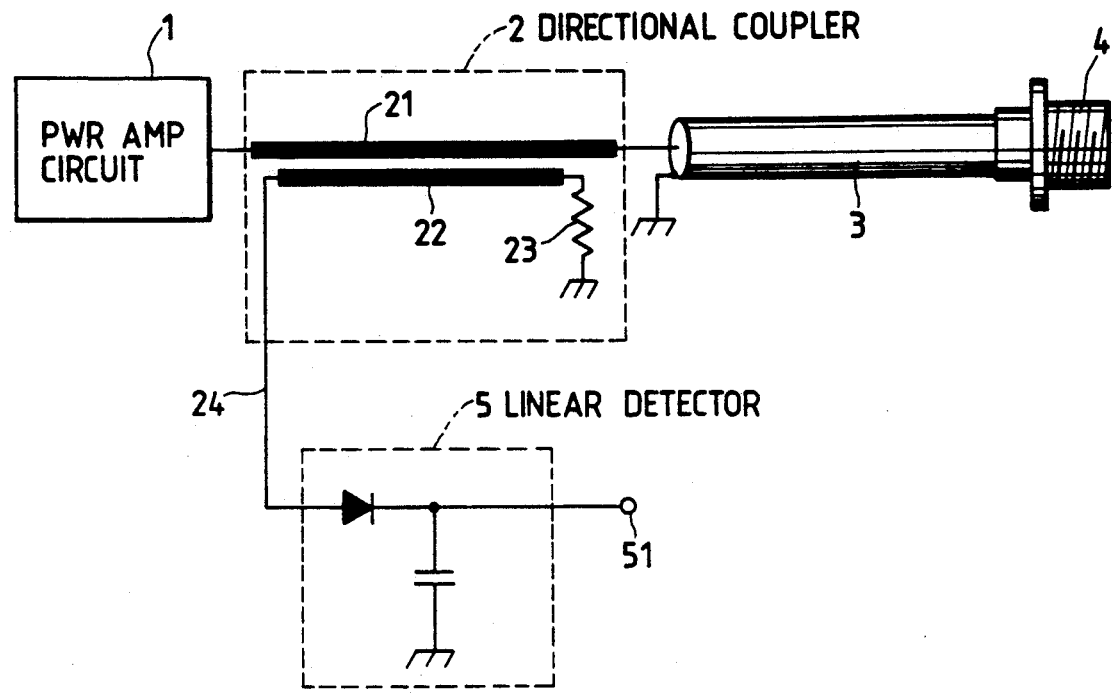
FIG. 1 is a diagram of a prior-art RF power amplifier.

With reference to FIG. 1, a prior-art RF power amplifier includes an RF power amplifying circuit 1, a directional coupler 2, a coaxial line 3, and an antenna connector 4. The output terminal of the RF power amplifying circuit 1 is connected to the antenna connector 4 via the directional coupler 2 and the coaxial line 3. The RF power amplifying circuit 1 serves to amplify an input RF signal to a desired power level. The coaxial line 3 has a characteristic impedance equal to the rated output impedance of the RF power amplifying circuit 1.

The directional coupler 2 includes a pair of strip lines 21 and 22, and a terminating resistor 23. The strip lines 21 and 22 extend in parallel, and have electric lengths corresponding to a ¼-wavelength. The directional coupler 2 has an output terminal 24 which is subjected to an RF signal proportional to the power of traveling wave, that is, the power transmitted from the RF power amplifying circuit 1 toward the antenna connector 4 (the forward-transmitted power). The directional coupler 2 is connected to a linear detector 5 via the output terminal 24. The RF signal on the output terminal 24 is detected by the linear detector 5. The linear detector 5 outputs a voltage to a forward-transmitted power reference terminal 51 which is proportional to the amplitude of the detected RF signal.

The RF signal which appears at the output terminal 24 of the directional coupler 2 is proportional to the power of traveling wave regardless of the impedance matching with a load connected to the antenna connector 4. In cases where the impedance of a load is equal to the output impedance of the RF power amplifying circuit 1, reflected wave is absent so that the power fed to the load and the power of traveling wave are equal to each other. Thus, in these cases, the voltage at the forward-transmitted power reference terminal 51 is proportional to the amplitude of traveling wave, that is, the square root of the output power.

The prior-art RF power amplifier of FIG. 1 has the following problem. In cases where the frequency of a handled RF signal is low, the strip lines 21 and 22 are long and thus the directional coupler 2 is large in size. If the strip lines 21 and 22 are shorter than a length corresponding to a ¼-wavelength, the degree of coupling is low so that it is generally difficult to generate an adequate-level signal at the forward-transmitted power reference terminal 51. Narrowing the spacing between the strip lines 21 and 22 increases the degree of coupling. However, in general printed wiring boards, since it is difficult to set the spacing between strip lines to 0.1 mm or less, narrowing the spacing between the strip lines is significantly limited.

Figure 2:
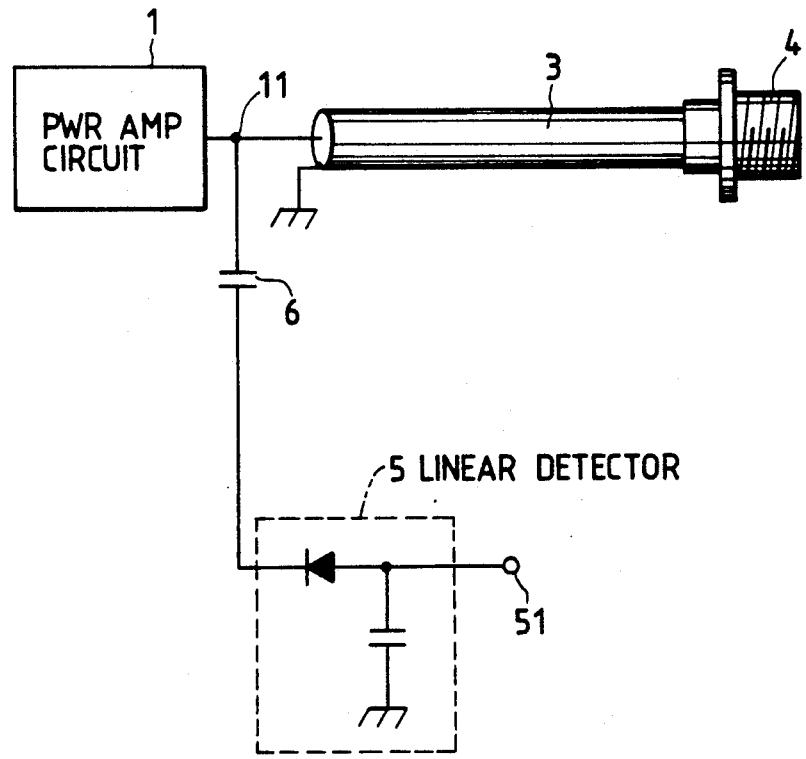
FIG. 2 is a diagram of another prior-art RF power amplifier.

FIG. 2 shows another prior-art RF power amplifier which includes an RF power amplifying circuit 1, a coaxial line 3, an antenna connector 4, and a linear detector 5. The output terminal of the RF power amplifying circuit 1 is connected to the antenna connector 4 via the coaxial line 3. The linear detector 5 is connected to the output terminal 11 of the RF power amplifying circuit 1 via a coupling capacitor 6. The RF power amplifying circuit 1 serves to amplify an input Rf signal to a desired power level. The coaxial line 3 has a characteristic impedance equal to the rated output impedance of the RF power amplifying circuit 1. The coupling capacitor 6 has such a capacitance as to provide an impedance sufficiently smaller than the rated output impedance of the RF power amplifying circuit 1.

A small portion of an RF signal at the output terminal 11 of the RF power amplifying circuit 1 is fed to the linear detector 5 via the coupling capacitor 6, and is detected by the linear detector 5. The linear detector 5 outputs a dc signal to a forward-transmitted power reference terminal 51 which is proportional to the amplitude of the RF signal at the output terminal 11 of the RF power amplifying circuit 1.

In cases where the impedance of a load connected to the antenna connector 4 is equal to the output impedance of the RF power amplifying circuit 1 so that good matching occurs, reflected wave is absent and therefore the power fed to the load and the power of traveling wave are equal to each other. Thus, in these cases, the dc signal at the forward-transmitted power reference terminal 51 is proportional to the amplitude of traveling wave, that is, the square root of the output power.

The prior-art RF power amplifier of FIG. 2 has the following problem. In cases where matching with a load is bad, the dc signal at the forward-transmitted power reference terminal 51 does not accurately represent the forward-transmitted power. For example, in cases where a load corresponds to extreme conditions such as open conditions or short-circuited conditions, the voltage at the forward-transmitted power reference terminal 51 is sometimes null according to the phase difference between the traveling wave voltage and the reflected wave voltage. In such cases, output power control responsive to the dc signal at the forward-transmitted power reference terminal 51 tends to be inaccurate and unreliable.

DESCRIPTION OF THE FIRST PREFERRED EMBODIMENT

Figure 3:
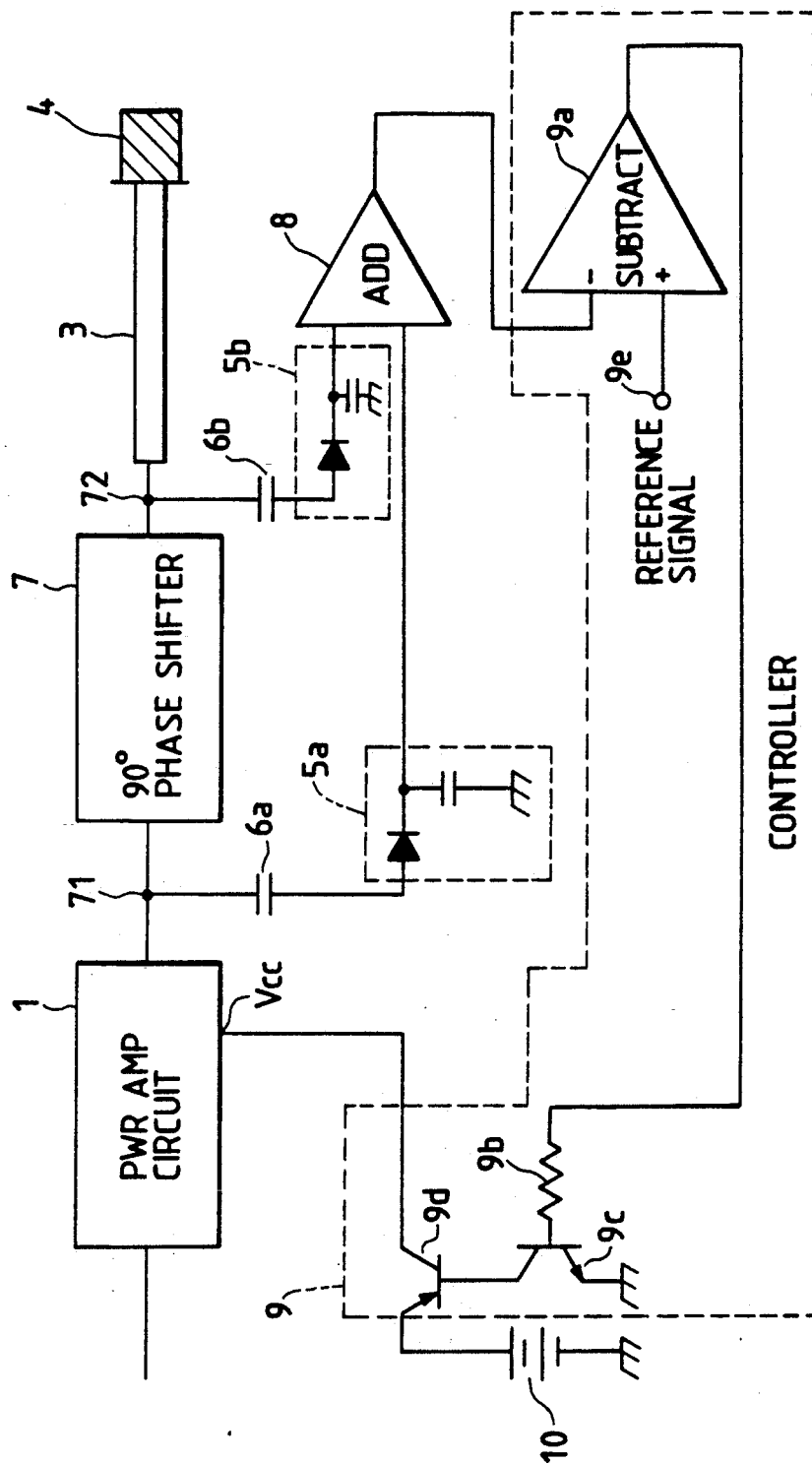
FIG. 3 is a diagram of an RF power amplifier according to a first embodiment of this invention.

With reference to FIG. 3, an RF power amplifier includes an RF power amplifying circuit 1, a coaxial line 3, an antenna connector 4, and a 90-degree phase shifter 7. The output terminal of the RF power amplifying circuit 1 is connected to the antenna connector 4 via the 90-degree phase shifter 7 and the coaxial line 3.

The RF power amplifying circuit 1 serves to amplify an input RF signal to a desired power level. The RF power amplifying circuit 1 has a power control terminal Vcc which also serves as a dc power supply reception terminal. The amplification gain of the RF power amplifying circuit 1, that is, the output power of the RF power amplifying circuit 1, depends on a signal fed to the power control terminal Vcc (a dc voltage at the power control terminal Vcc). The output RF signal of the RF power amplifying circuit 1 is applied to the 90-degree phase shifter 7 via its input terminal 71. The 90-degree phase shifter 7 delays the output RF signal of the RF power amplifying circuit 1, and thereby shifts the phase of the output RF signal of the RF power amplifying circuit 1 by 90 degrees ($\pi/2$) or about 90 degrees ($\pi/2$). The output RF signal of the 90-degree phase shifter 7 is guided to the antenna connector 4 via the coaxial line 3. The coaxial line 3 has a characteristic impedance equal to the rated output impedance of the RF power amplifying circuit 1.

Figure 4:
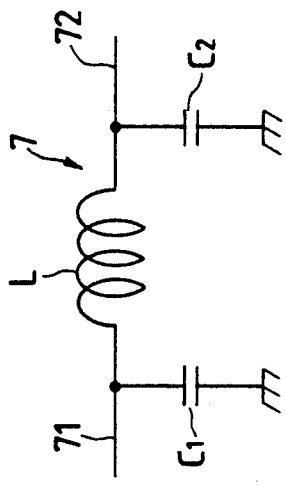
FIG. 4 is a schematic diagram of the phase shifter of FIG. 3.

As shown in FIG. 4, the 90-degree phase shifter 7 is composed of a $\pi$-type lumped parameter circuit having a combination of an inductor L and capacitors C1 and C2. One end of the inductor L is connected to the input terminal 71, and the other end of the inductor L is connected to an output terminal 72. One end of the capacitor C1 is connected to the input terminal 71, and the other end of the capacitor C1 is grounded. One end of the capacitor C2 is connected to the output terminal 72, and the other end of the capacitor C2 is grounded. The inductance of the inductor L and the capacitances of the capacitors C1 and C2 are chosen so that the 90-degree phase shifter 7 can execute a desired phase shifting process.

As shown in FIG. 3, the RF power amplifier also includes linear detectors 5a and 5b. The input terminal of the linear detector 5a is connected to the input terminal 71 of the 90-degree phase shifter 7 via a capacitor 6a. The capacitance of the capacitor 6a is chosen so as to provide an impedance sufficiently higher than the input impedance of the 90-degree phase shifter 7. A small portion of the RF signal at the input terminal 71 of the 90-degree phase shifter 7 is fed via the capacitor 6a to the linear detector 5a, and is detected by the linear detector 5a. The input terminal of the linear detector 5b is connected to the output terminal 72 of the 90-degree phase shifter 7 via a capacitor 6b. The capacitance of the capacitor 6b is chosen so as to provide an impedance sufficiently greater than the output impedance of the 90-degree phase shifter 7. A small portion of the RF signal at the output terminal 72 of the 90-degree phase shifter 7 is fed via the capacitor 6b to the linear detector 5b, and is detected by the linear detector 5b.

The RF power amplifier further includes an adder 8 and a controller 9. A first input terminal of the adder 8 receives the output signal of the linear detector 5a. A second input terminal of the adder 8 receives the output signal of the linear detector 5b. The adder 8 adds the output signal of the linear detector 5a and the output signal of the linear detector 5b. The controller 9 is connected between the output terminal of the adder 8 and the power control terminal Vcc of the RF power amplifying circuit 1. The controller 9 controls the gain of the RF power amplifying circuit 1 in response to the output signal of the adder 8.

The amplitude of the voltage of traveling wave and the amplitude of the voltage of reflected wave are now represented by A and B respectively. The voltage V1 at the input terminal 71 of the 90-degree phase shifter 7 and the voltage V2 at the output terminal 72 of the 90-degree phase shifter 7 are expressed as follows.

$$V1 = A \cdot \sin \omega t + B \cdot \sin(\omega t - \phi)$$

$$V2 = A \cdot \sin\left(\omega t - \frac{\pi}{2}\right) + B \cdot \sin\left(\omega t - \phi + \frac{\pi}{2}\right)$$

where "$\omega$" denotes the angular frequency of the RF signal, and "$\phi$" denotes the phase difference between the traveling wave and the reflected wave. The phase difference $\phi$ depends on the impedance of a load and the effective length of a line between the output terminal of the RF power amplifying circuit 1 and the load. Generally, reflected wave is smaller than traveling wave, and there is the relation "$0 \leq B \leq A$".

In cases where the impedance of a load connected to the antenna connector 4 is equal to the output impedance of the RF power amplifying circuit 1 so that good matching occurs, reflected wave is absent and thus B=0. In these cases, the amplitudes of the voltages V1 and V2 are equal, and the adder 8 outputs a dc signal proportional to the amplitude A of the traveling wave, that is, the square root of the RF output power.

In cases where the impedance of a load differs from the output impedance of the RF power amplifying circuit 1 and the impedance of the coaxial line 3 so that good matching does not occur, standing wave is present in the coaxial line 3. In these cases, the amplitude Va of the voltage V1 and the amplitude Vb of the voltage V2 are given as follows.

$$Va = \sqrt{A^2 + B^2 + 2AB\cos\phi}$$

$$Vb = \sqrt{A^2 + B^2 - 2AB\cos\phi}$$

Thus, the adder 8 outputs a dc signal proportional to the sum of the amplitudes Va and Vb. When the amplitude A of the traveling wave is regarded as being fixed and the amplitude B of the reflected wave is regarded as being variable in the range of 0 to A, the sum of the amplitudes Va and Vb corresponds to a monotonically-increasing function with respect to B. Specifically, according to this monotonically-increasing function, the sum of the amplitudes Va and Vb is equal to a minimum value "2A" at B=0 and is equal to a maximum value at B=A. In addition, when $\phi=0$, the sum of the amplitudes Va and Vb is equal to a given value "2A". The maximum value of the sum of the amplitudes Va and Vb which occurs at B=A is expressed as follows.

$$Va + Vb = 2A \left( \left| \cos\frac{\phi}{2} \right| + \left| \sin\frac{\phi}{2} \right| \right)$$

It is understood from this equation that the maximum value of the sum of the amplitudes Va and Vb is approximately equal to 2.83A. Thus, in cases where an arbitrary load is connected to the antenna connector 4, the sum of the amplitudes Va and Vb is equal to a value in the range of 2A to 2.83A.

The controller 9 includes a subtracter 9a, a resistor 9b, and transistors 9c and 9d. The inverting input terminal of the subtracter 9a receives the output signal of the adder 8. The non-inverting input terminal of the subtracter 9a receives a reference signal via an input terminal 9e which represents a desired output power level. The subtracter 9a subtracts the output signal of the adder 8 from the reference signal. The output signal of the subtracter 9a is applied to the base of the transistor 9c via the resistor 9b. The emitter of the transistor 9c is grounded. The collector of the transistor 9c is connected to the base of the transistor 9d. The emitter of the transistor 9d is connected to the positive terminal of a dc power source 10. The negative terminal of the dc power source 10 is grounded. The collector of the transistor 9d is connected to the power control terminal Vcc of the RF power amplifying circuit 1. The combination of the transistors 9c and 9d and the dc power source 10 generates a signal in response to the output signal of the subtracter 9a, and outputs the generated signal to the power control terminal Vcc of the RF power amplifying circuit 1. Specifically, the signal at the power control terminal Vcc of the RF power amplifying circuit 1 increases and decreases as the output signal of the subtracter 9a increases and decreases respectively.

The output power control is executed as follows. If the power of the output RF signal of the RF power amplifying circuit 1 increases, the level of the output signal of the adder 8 increases so that the level of the output signal of the subtracter 9a decreases. The decrease in the level of the output signal of the subtracter 9a causes a decrease in the signal at the power control terminal Vcc of the RF power amplifying circuit 1. The decrease in the signal at the power control terminal Vcc of the RF power amplifying circuit 1 reduces the gain of the RF power amplifying circuit 1, thereby canceling the increase in the power of the output RF signal of the RF power amplifying circuit 1. If the power of the output RF signal of the RF power amplifying circuit 1 decreases, the level of the output signal of the adder 8 decreases so that the level of the output signal of the subtracter 9a increases. The increase in the level of the output signal of the subtracter 9a causes an increase in the signal at the power control terminal Vcc of the RF power amplifying circuit 1. The increase in the signal at the power control terminal Vcc of the RF power amplifying circuit 1 raises the gain of the RF power amplifying circuit 1, thereby canceling the decrease in the power of the output RF signal of the RF power amplifying circuit 1. Accordingly, the power of the output RF signal of the RF power amplifying circuit 1 is maintained at essentially the desired level represented by the reference signal applied to the subtracter 9a.

Figure 5:
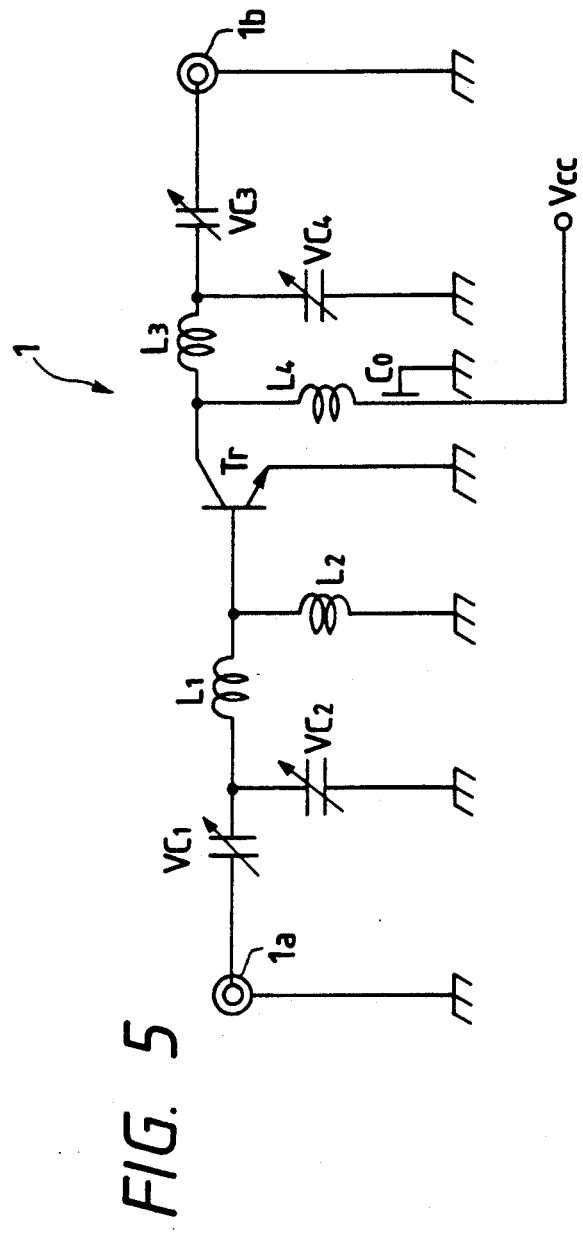
FIG. 5 is a schematic diagram of the RF power amplifying circuit of FIG. 3.

As shown in FIG. 5, the RF power amplifying circuit 1 includes a transistor Tr, an input terminal 1a, and an output terminal 1b. An input matching section is connected between the input terminal 1a and the base of the transistor Tr. The input matching section includes a combination of variable capacitors VC1 and VC2 and inductors L1 and L2. The emitter of the transistor Tr is grounded. An output matching section is connected between the collector of the transistor Tr and the output terminal 1b. The output matching section includes a combination of variable capacitors VC3 and VC4, inductors L3 and L4, and a feed-through capacitor CO. The power control terminal Vcc is connected to the collector of the transistor Tr via the feed-through capacitor CO and the inductor L4.

It should be noted that this embodiment may be modified as follows. The adder 8 may be of the type adding the square of the output signal of the linear detector 5a and the square of the output signal of the linear detector 5b. The 90-degree phase shifter 7 may have one of known internal structures other than the design of FIG. 4. The 90-degree phase shifter 7 may be replaced by a 270-degree phase shifter.

DESCRIPTION OF THE SECOND PREFERRED EMBODIMENT

Figure 6:
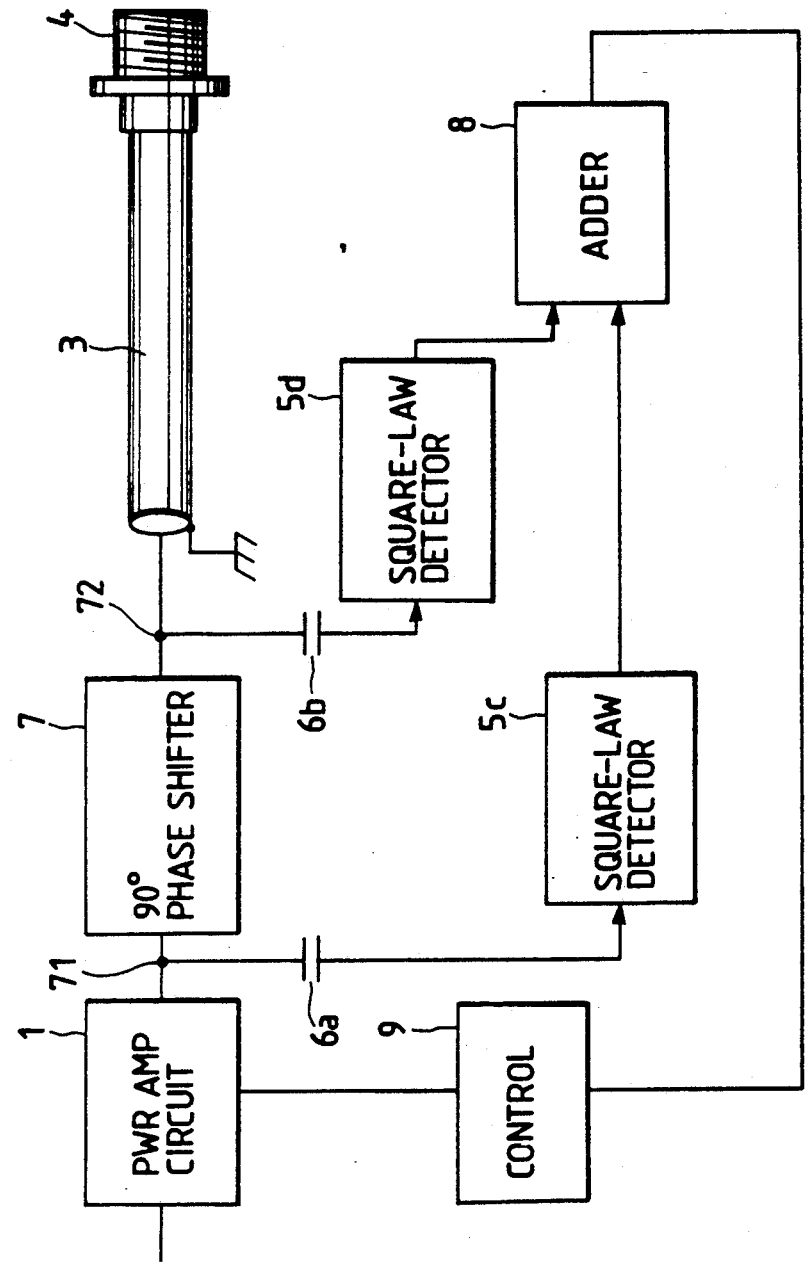
FIG. 6 is a diagram of an RF power amplifier according to a second embodiment of this invention.

FIG. 6 shows a second embodiment of this invention which is similar to the embodiment of FIGS. 3–5 except that the linear detectors 5a and 5b are replaced by square-law detectors 5c and 5d respectively. Each of the square-law detectors 5c and 5d outputs a dc signal which is proportional to the square of the magnitude of an RF signal inputted thereinto.

In the embodiment of FIG. 6, an adder 8 outputs a dc signal which is proportional to the sum of the square of an amplitude Va and the square of an amplitude Vb. The sum of the square of the amplitude Va and the square of the amplitude Vb is given as follows.

$$Va^2 + Vb^2 = 2(A^2 + B^2)$$

According to the characteristics of the square-law detectors 5c and 5d, the level of the forward-transmitted power which is decided by the square-law detectors 5c and 5d is greater than the actual level in cases where the matching with the load becomes worse. This action of the square-law detectors 5c and 5d enables the power control mechanism to quickly reduce the output power in such cases.

What is claimed is:

1. An RF power amplifier comprising:
   an RF power amplifying section having a variable amplification gain;
   a phase shifter connected to the RF power amplifying section for shifting a phase of an output signal of the RF power amplifying section, the phase shifter having an input terminal subjected to the output signal of the RF power amplifying section and an output terminal subjected to a signal which results from shifting the phase of the output signal of the RF power amplifying section;
   generating means for generating a control signal on the basis of the signals at the input terminal and the output terminal of the phase shifter, the control signal representing a power of the output signal of the RF power amplifying section; and
   means for controlling the amplification gain of the RF power amplifying section in response to the control signal,
   wherein the generating means comprises a first detector for detecting a portion of the signal at the input terminal of the phase shifter, a second detector for detecting a portion of the signal at the output terminal of the phase shifter, and adder for adding an output signal of the first detector and an output signal of the second detector, and means for generating the control signal on the basis of an output signal of the adder.

2. The RF power amplifier of claim 1, wherein the first and second detectors comprise linear detectors respectively, and the adder comprises means for adding a square of the output signal of the first detector and a square of the output signal of the second detector.

3. The RF power amplifier of claim 1, wherein the phase shifter comprises means for shifting the phase of the output signal of the RF power amplifying section by 90 degrees.

4. The RF power amplifier of claim 1, wherein said first and second detectors respectively comprise first and second square-law detecting means respectively connected to said input and output terminals of said phase shifter.

5. The RF power amplifier of claim 1, further comprising first and second coupling means for respectively coupling the signal at the input terminal of the phase shifter to said first detector and the signal at the output terminal of the phase shifter to said second detector, said coupling means comprising impedance elements having predetermined impedances for providing respective small portions of the respective signals at the input and output terminals of the phase shifter to said first and detectors.

6. The RF power amplifier of claim 5, wherein said first and second coupling means comprise respective capacitors having capacitances providing respective impedances respectively sufficiently higher than an input impedance and an output impedance of said phase shifter to provide said small portions of the respective signals to said first and second detectors.

7. The RF power amplifier of claim 1 wherein said first and second detectors comprise respective diodes having common polarity relative to the respective input and output terminals of said phase shifter.

8. The RF power amplifier of claim 1 wherein said first detector comprises a first diode connected in a predetermined polarity relative to said input terminal of said phase shifter and outputting a first signal to a first capacitor connected thereto, and said second detector comprises a second diode connected in said predetermined polarity relative to said output terminal of said phase shifter and outputting a second signal to a second capacitor connected thereto.

9. The RF power amplifier of claim 1, further comprising inverting means for inverting an output signal of the adder thereby to provide a decrease in said control signal in response to an increase in the sum of the signals at the input and output signals of said phase shifter and an increase in said control signal in response to a decrease in the sum of the signals at the input and output signals of said phase shifter.

10. An RF power amplifier comprising:
    an RF power amplifying section having a variable amplification gain;
    a phase shifter connected to the RF power amplifying section for shifting a phase of an output signal of the RF power amplifying section, the phase shifter having an input terminal subjected to a first signal, said first signal being the output signal of the RF power amplifying section, and an output terminal subjected to a second signal, said second signal being the output signal of the RF power amplifying section phase shifted by the phase shifter,
    wherein said first signal includes first and second varying components having first and second amplitudes respectively corresponding to amplitudes of a traveling wave and a reflected wave and said second signal includes third and fourth varying components having said first and second amplitudes;
    a first detector for detecting a portion of the signal at the input terminal of the phase shifter;
    a second detector for detecting a portion of the signal at the output terminal of the phase shifter;
    generating means responsive to an output signal of the first detector and an output signal of the second detector for generating a control signal which increases monotonically with said second amplitude between minimum and maximum values when a standing wave is present; and
    gain control means responsive to said control signal for controlling the amplification gain of the RF power amplifying section in response to the control signal.

11. The RF power amplifier of claim 10, wherein the first and second detectors comprise linear detectors respectively.

12. The RF power amplifier of claim 10, wherein the first and second detectors comprise square-law detectors respectively.

13. The RF power amplifier of claim 10, wherein the control-signal generating means comprises an adder for adding the output signal of the first detector and the output signal of the second detector.

14. The RF power amplifier of claim 10, wherein the first and second detectors comprise detectors respectively outputting signals representing squares of the signals at the input and output terminals of the phase shifter, and the control-signal generating means comprises an adder for adding a square of the signal at the input terminal of the phase shifter as represented by the output signal of the first detector and a square of the signal at the output terminal of the phase shifter as represented by the output signal of the second detector.

15. The RF power amplifier of claim 10, wherein the phase shifter comprises means for shifting the phase of the output signal of the RF power amplifying section by 90 degrees.

16. The RF power amplifier of claim 10, wherein said generating means comprises:
   means for providing said control signal to said gain control means for reducing the amplification gain of said RF power amplifying section in response to an increase in the power of the output signal of the RF power amplifying section and for increasing the amplification gain of said RF power amplifying section in response to a decrease in the power of the output signal of the RF power amplifying section.

17. The RF power amplifier of claim 16, further comprising inverting means for inverting a sum signal representing a sum of said output signals of the first and second detectors thereby to provide a decrease in said control signal in response to an increase in the power of the output signal of the RF power amplifying section.

18. The RF power amplifier of claim 16, wherein said generating means further comprises an adder for adding said output signals of the first and second detectors to produce a sum signal and a subtracter for subtracting the output signal of the adder from a reference signal, thereby to maintain a power level of the output signal of the RF power amplifying section at a desired level represented by the reference signal.

19. The RF power amplifier of claim 10, wherein said generating means comprises means for outputting a dc signal proportional to a sum of amplitudes of said first and second signals and for varying an amplitude of said dc signal from twice said first amplitude of said traveling wave to approximately 2.83 times said first amplitude as said second amplitude of said reflected wave varies from zero to said first amplitude.

20. The RF power amplifier of claim 10, wherein said RF power amplifying section outputs a signal to a load, and wherein said phase shifter is connected in series between the load and said RF power amplifying section thereby providing to the load a phase shifted output signal of the RF power amplifying section.

21. An RF power amplifier comprising:
   an RF power amplifying section having a variable amplification gain;
   a phase shifter connected to the RF power amplifying section for shifting a phase of an output signal of the RF power amplifying section, the phase shifter having an input terminal subjected to the output signal of the RF power amplifying section and an output terminal subjected to a signal which results from shifting the phase of the output signal of the RF power amplifying section;
   generating means for generating a control signal on the basis of the signals at the input terminal and the output terminal of the phase shifter, the control signal representing a power of the output signal of the RF power amplifying section; and
   means for controlling the amplification gain of the RF power amplifying section in response to the control signal, wherein said generating means comprises first and second linear detecting means respectively connected to said input and output terminals of said phase shifter and adding means for adding output signals of said first and second linear detecting means and for producing an output signal proportional to a sum of amplitudes of said output signal of the RF power amplifying section and the signal shifted by said phase shifter.

22. The RF power amplifier of claim 21, wherein said adding means further operates for establishing said control signal to be proportional to a square root of the power of the output signal of the RF power amplifying section when a reflected wave is not present.

23. The RF power amplifier of claim 21, further comprising first and second connecting means for connecting said input and output terminals of said phase shifter to said first and second linear detecting means, respectively, said first connecting means having an impedance greater than an input impedance of said first linear detecting means and said second connecting means having an impedance greater than an output impedance of said phase shifter.

24. An RF power amplifier comprising:
   an RF power amplifying section having a variable amplification gain;
   a phase shifter connected to the RF power amplifying section for shifting a phase of an output signal of the RF power amplifying section, the phase shifter having an input terminal subjected to a first signal, said first signal being the output signal of the RF power amplifying section, and an output terminal subjected to a second signal, said second signal being the output signal of the RF power amplifying section phase shifted by the phase shifter,
   wherein said first signal includes first and second varying components having first and second amplitudes respectively corresponding to amplitudes of a traveling wave and a reflected wave and said second signal includes third and fourth varying components having said first and second amplitudes;
   generating means responsive to the signals at the input terminal and the output terminal of the phase shifter for generating a control signal representative of a power of the output signal of the RF power amplifying section which increases monotonically with said second amplitude between minimum and maximum values when a standing wave is present; and
   gain control means responsive to said control signal for controlling the amplification gain of the RF power amplifying section to maintain the power of the output signal of the RF power amplifying section substantially at a predetermined constant level.

25. The RF power amplifier of claim 24, wherein said generating means comprises:
   detecting means for detecting the first and second signals for producing respective detected signals corresponding thereto, and
   adding means for adding the detected signals to provide an adding output signal to said gain control means for reducing the amplification gain of said RF power amplifying section in response to an increase in the power of the output signal of the RF power amplifying section and for increasing the amplification gain of said RF power amplifying section in response to a decrease in the power of the output signal of the RF power amplifying section.

26. The RF power amplifier of claim 25, further comprising inverting means for inverting the adding output signal of the adding means thereby to provide a decrease in said control signal in response to an increase in the power of the output signal of the RF power amplifying section and an increase in said control signal in response to a decrease in the power of the output signal of the RF power amplifying section.

27. The RF power amplifier of claim 26, wherein said inverting means comprises a subtracter for subtracting the adding output signal of the adding means from a reference signal, thereby to maintain a power of the output signal of the RF power amplifying section at a desired level represented by the reference signal.

28. An RF power amplifier comprising:
an RF power amplifying section having a variable amplification gain;
a phase shifter connected to the RF power amplifying section for shifting a phase of an output signal of the RF power amplifying section, the phase shifter having an input terminal subjected to a first signal, said first signal being the output signal of the RF power amplifying section, and an output terminal subjected to a second signal, said second signal being the output signal of the RF power amplifying section phase shifted by the phase shifter,
wherein said first signal includes first and second varying components having first and second amplitudes respectively corresponding to amplitudes of a traveling wave and a reflected wave and said second signal includes third and fourth varying components having said first and second amplitudes
a first detector for detecting a portion of the signal at the input terminal of the phase shifter;
a second detector for detecting a portion of the signal at the output terminal of the phase shifter;
generating means responsive to an output signal of the first detector and an output signal of the second detector for generating a control signal representing a power of the output signal of the RF power amplifying section which increases monotonically between minimum and maximum values with said second amplitude when a standing wave is present; and
gain control means responsive to said control signal for controlling the amplification gain of the RF power amplifying section in response to the control signal to maintain the power of the output signal of the RF power amplifying section essentially at a predetermined constant level.

* * * * *